United States Patent
Holzhauer et al.

(10) Patent No.: US 11,766,708 B2
(45) Date of Patent: *Sep. 26, 2023

(54) METHOD FOR THE PRODUCTION OF A COOLING PLATE

(71) Applicant: HOLZHAUER GMBH & CO. KG, Sigmaringendorf (DE)

(72) Inventors: Anton Holzhauer, Sigmaringendorf (DE); Joachim Holzhauer, Sigmaringendorf (DE)

(73) Assignee: Holzhauer GmbH & Co. KG, Sigmaringendorf (DE)

( * ) Notice: Subject to any disclaimer, the term of this patent is extended or adjusted under 35 U.S.C. 154(b) by 727 days.

This patent is subject to a terminal disclaimer.

(21) Appl. No.: 16/626,464

(22) PCT Filed: Jul. 3, 2018

(86) PCT No.: PCT/EP2018/000336
§ 371 (c)(1),
(2) Date: Dec. 24, 2019

(87) PCT Pub. No.: WO2019/007547
PCT Pub. Date: Jan. 10, 2019

(65) Prior Publication Data
US 2020/0222959 A1    Jul. 16, 2020

(30) Foreign Application Priority Data

Jul. 7, 2017    (DE) .................... 10 2017 006 425.3
Jul. 2, 2018    (DE) .................... 10 2018 005 265.7

(51) Int. Cl.
*B21C 23/06*    (2006.01)
(52) U.S. Cl.
CPC .................................. *B21C 23/06* (2013.01)

(58) Field of Classification Search
CPC .......... B21C 23/06; B21C 23/183; B21J 5/02; B21J 5/022; B21J 5/025; B21J 5/12;
(Continued)

(56) References Cited

U.S. PATENT DOCUMENTS 6,189,363 B1 * 2/2001 Lai ..................... B21C 23/14
72/267

FOREIGN PATENT DOCUMENTS

CN    1886522 A    12/2006
CN    201081589 Y    7/2008
(Continued)

OTHER PUBLICATIONS

International Search Report issued by the European Patent Office in International Application PCT/EP2018/000336.
(Continued)

*Primary Examiner* — Teresa M Ekiert
(74) *Attorney, Agent, or Firm* — Henry M. Feiereisen LLC

(57) ABSTRACT

In a method for producing a cooling plate, a workpiece in the form of a flat material blank with uniform material thickness is precisely centered in a tool. A substantially radially extending flat peripheral edge of the workpiece is formed by an outer punch of the tool, as the workpiece is held down by an inner punch of the tool and the outer punch is pressed against the peripheral edge to thereby reduce the material thickness of the peripheral edge. Pins are formed on a coolant-swept effective surface of a base of the workpiece by the inner punch through pressing in cooperation with pin forming openings of the tool as the outer punch is held down, such that the pins protrude approximately perpendicular beyond the base and are surrounded by the peripheral edge.

12 Claims, 9 Drawing Sheets

(58) Field of Classification Search
CPC ..... B21J 9/02; B21J 9/022; B21J 13/02; B21J 13/025; B21J 13/03
See application file for complete search history.

(56) References Cited

FOREIGN PATENT DOCUMENTS

| | | |
|---|---|---|
| CN | 102623771 A | 8/2012 |
| CN | 104066305 A | 9/2014 |
| CN | 106450564 A | 2/2017 |
| CN | 106524815 A | 3/2017 |
| DE | 102013104630 A1 | 11/2013 |
| DE | 102015120835 A1 | 6/2016 |
| EP | 2944395 A1 | 11/2015 |
| EP | 3117953 A1 | 1/2017 |
| JP | 2008132523 A | 6/2008 |
| JP | 2010129774 A | 6/2010 |
| JP | 2012199324 A | 10/2012 |

OTHER PUBLICATIONS

Chinese Search Report dated Jan. 22, 2021 with respect to counterpart Chinese patent application 201880045453.2.
Translation of Chinese Search Report dated Jan. 22, 2021 with respect to counterpart Chinese patent application 201880045453.2.

\* cited by examiner

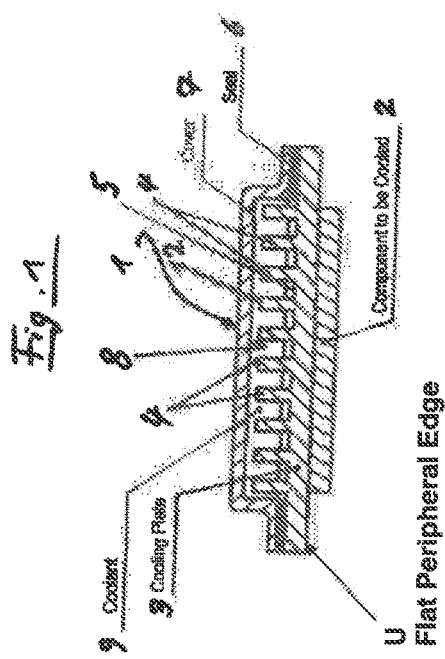

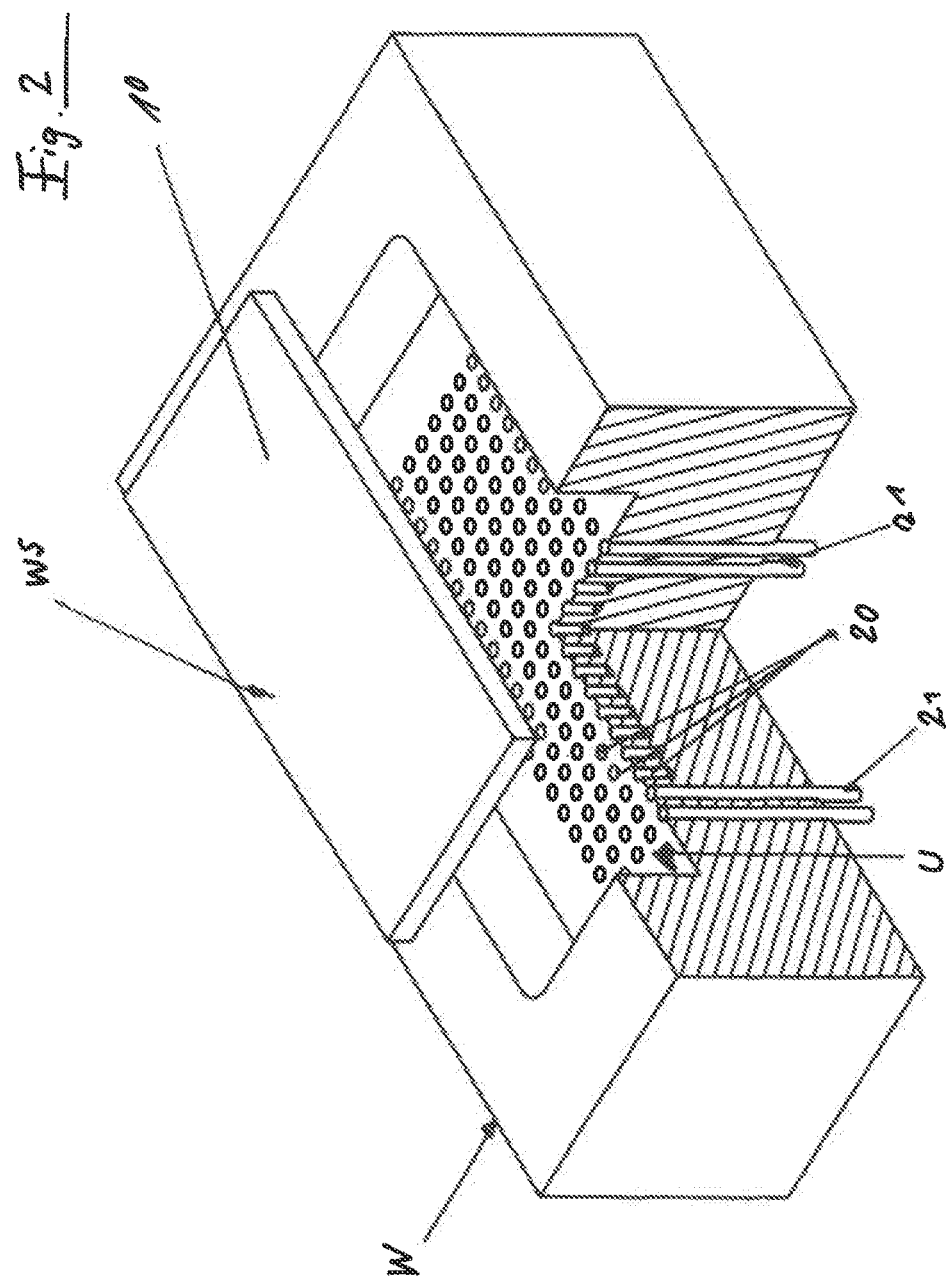

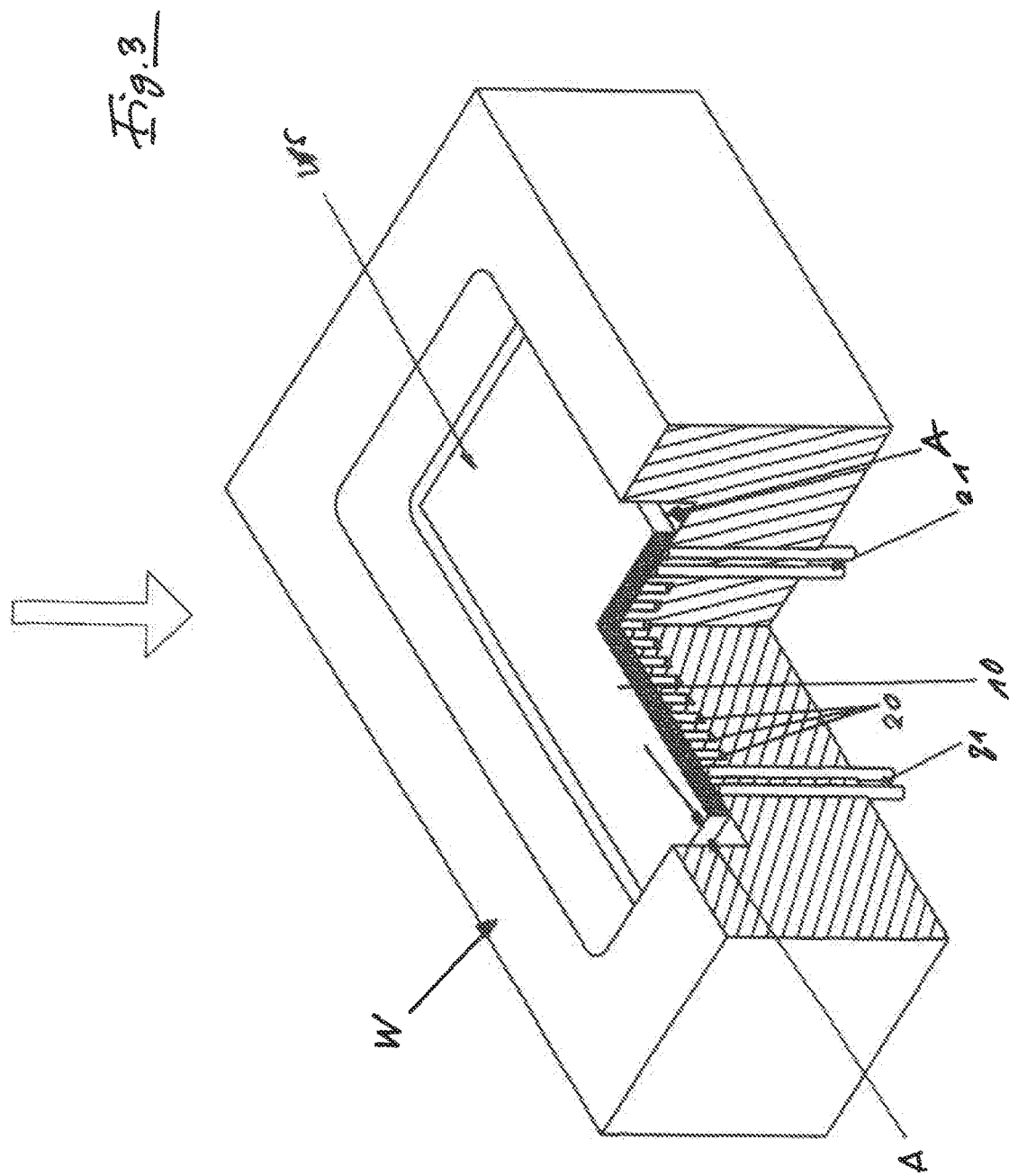

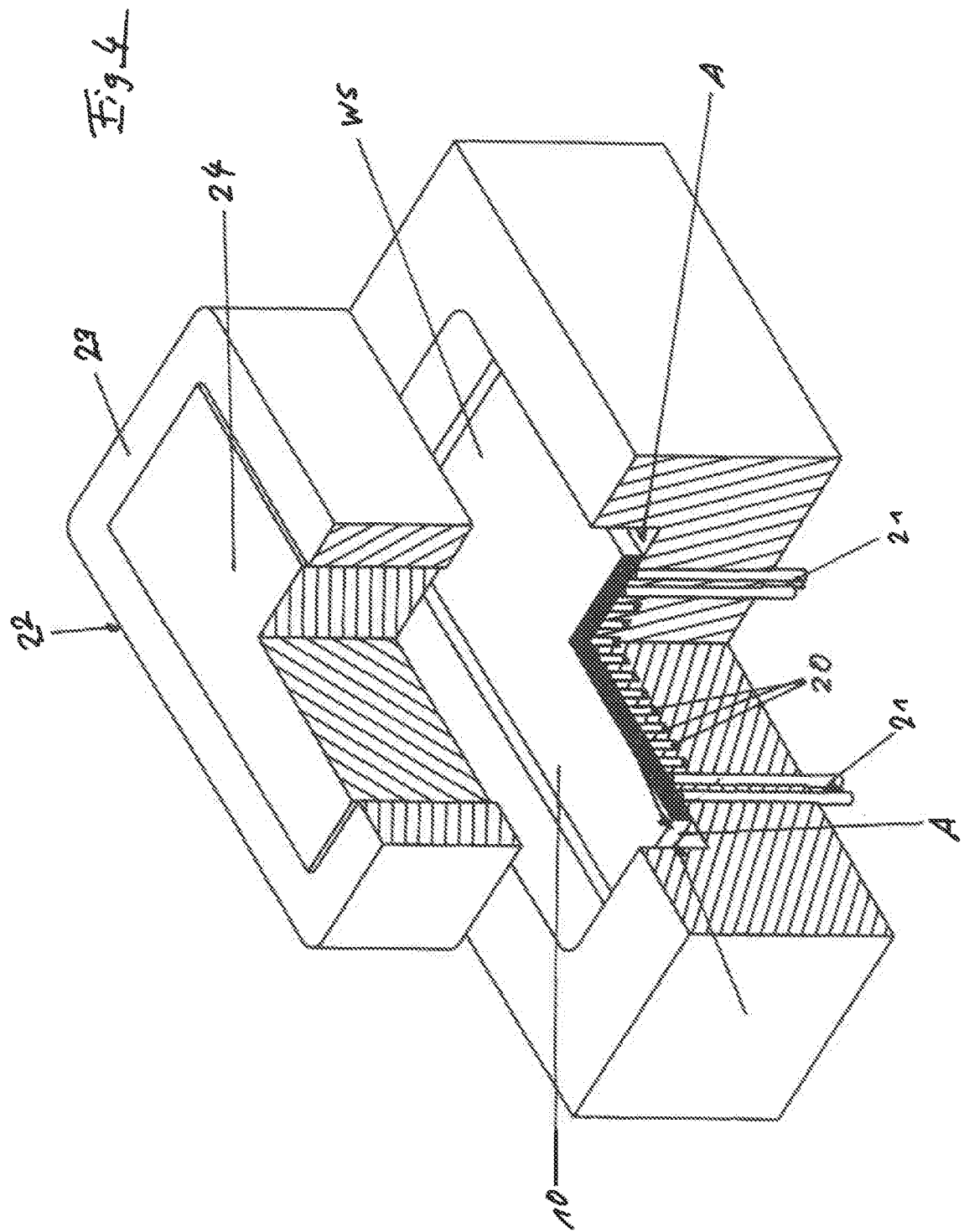

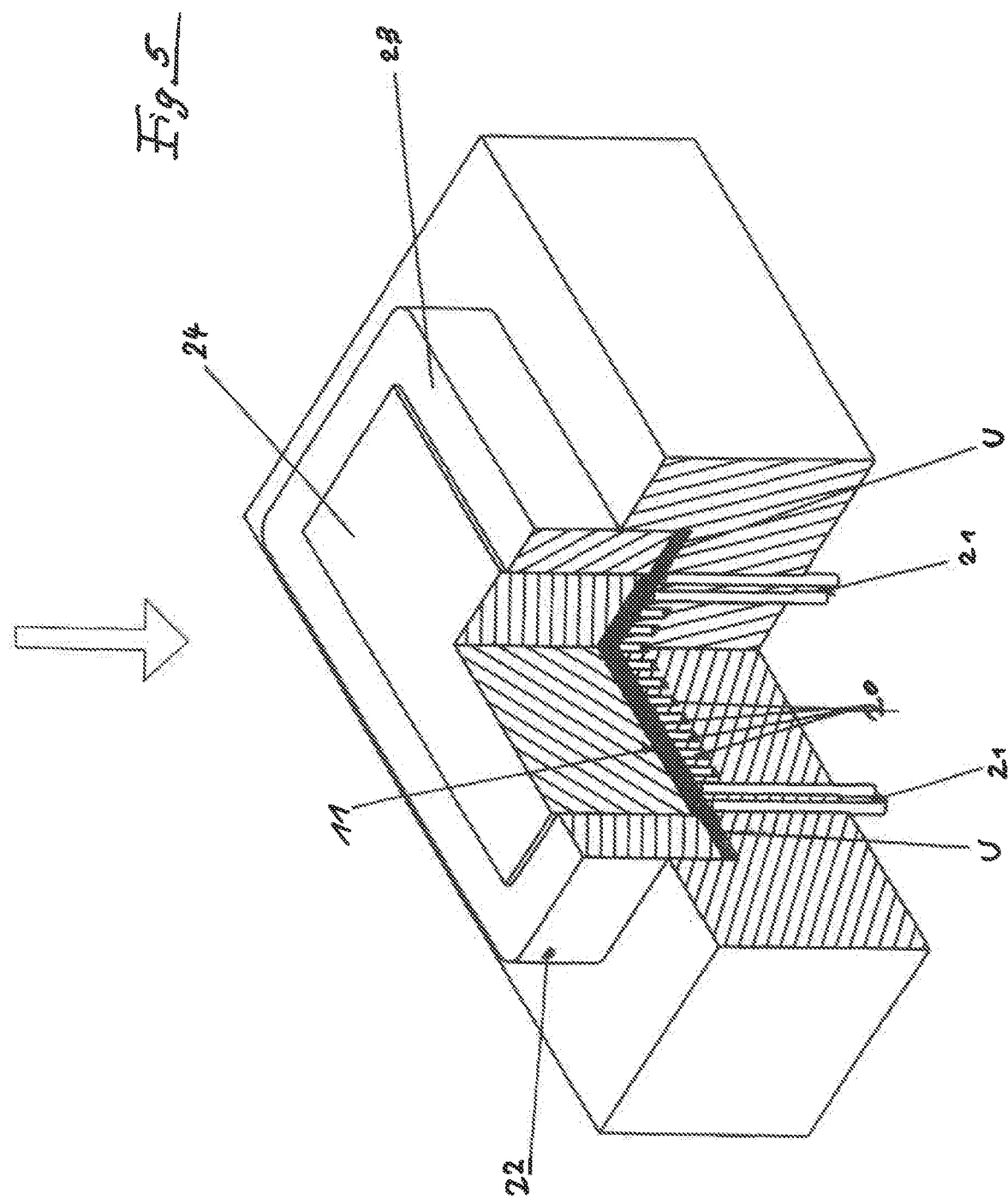

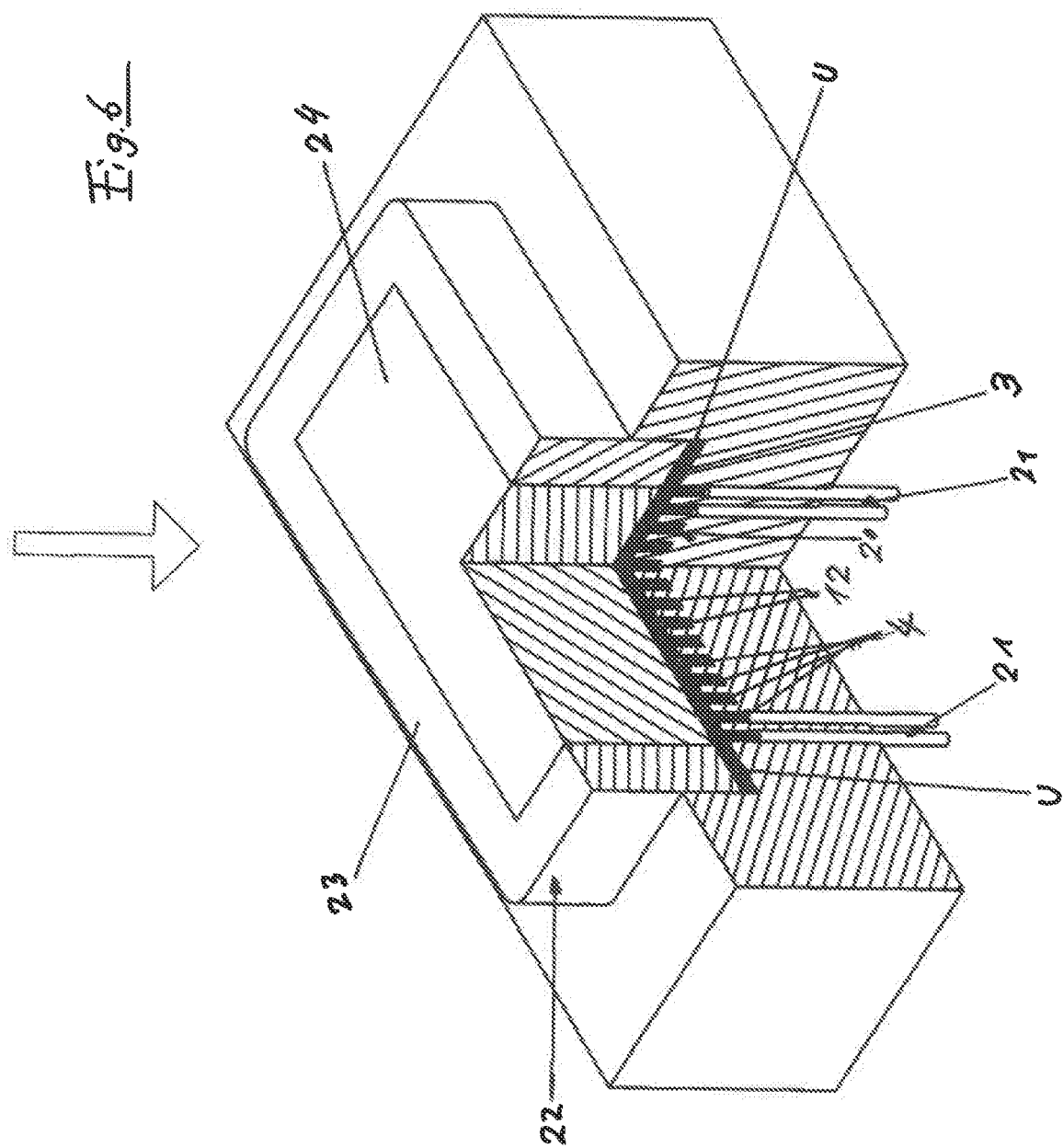

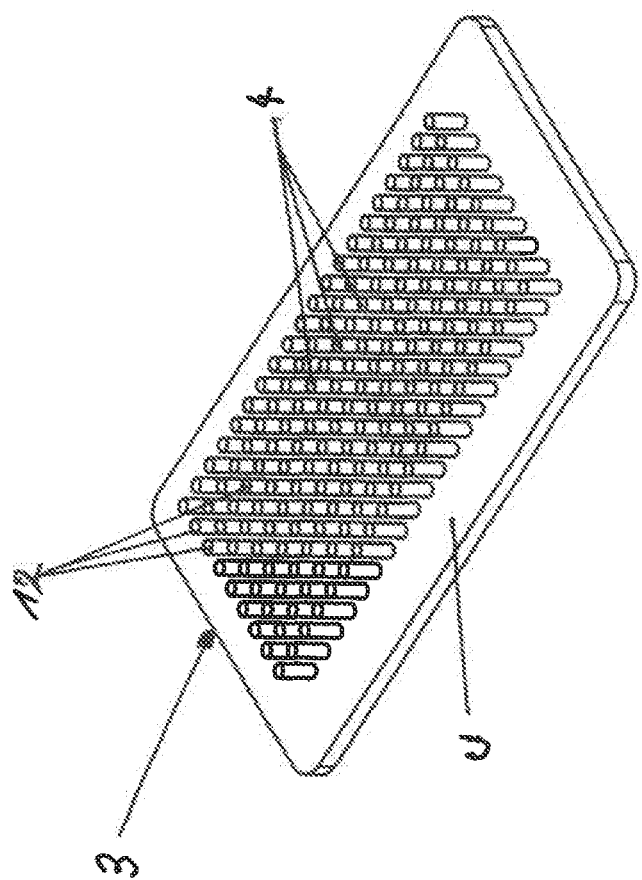

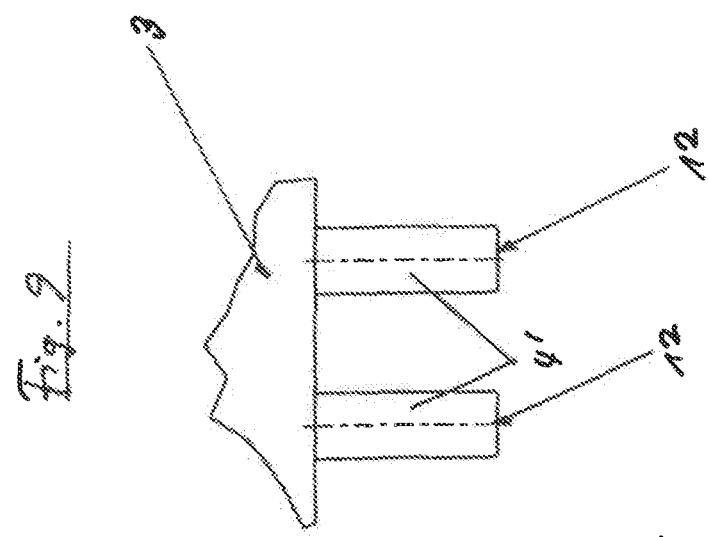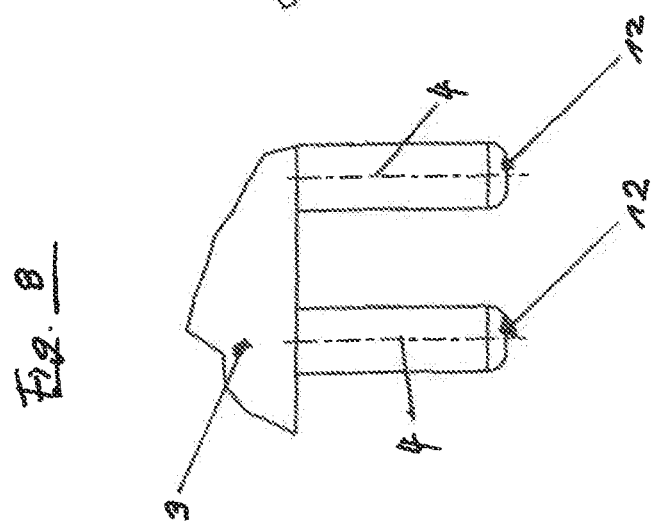

METHOD FOR THE PRODUCTION OF A COOLING PLATE

CROSS-REFERENCES TO RELATED APPLICATIONS

This application is the U.S. National Stage of International Application No. PCT/EP2018/000336, filed Jul. 3, 2018, which designated the United States and has been published as International Publication No. WO 2019/007547 and which claims the priorities of German Patent Applications, Serial No. 10 2017 006 425.3, filed Jul. 7, 2017 and Serial No. 102018 005 265.7, filed Jul. 2, 2018, pursuant to 35 U.S.C. 119(a)-(d).

BACKGROUND OF THE INVENTION

The invention relates to a method for the production of a cooling plate of a material with very good thermal conductivity, such as copper, aluminum, alloys thereof, or the like, with pins, protruding approximately perpendicular beyond a base on an effective surface swept by coolant, with the pins being surrounded by a substantially radially extending flat peripheral edge, wherein the cooling plate is produced in a workpiece by forming a workpiece.

Such cooling plates find application, for example, in battery constructions, inverters, fuel cells, heat-sensitive electrical or electronic components, such as chips or the like.

Cooling plates of a generic type are normally produced by forging or machining processes that usually require additional complex refinishing. To date, such cooling plates are relatively expensive to produce and oftentimes waste is created as the material with very good thermal conductivity is processed that is relatively cost intensive to produce.

DE 10 2015 120 835 A1 discloses a production process for cooling plates, in which a flat material is processed by rolling. This results in irregularly formed pins, which must be sufficiently spaced apart to create pins of substantially same length. Furthermore, complex, in particular time-consuming refinishing processes are required. Therefore, a smaller pin density is realized on the effective surface and the cooling effect is reduced.

The invention aims to provide a method for the production of a cooling plate of a type involved here, which can be realized inexpensively and is material-saving and resource-friendly and has an extremely effective cooling action with high pin density on the effective surface.

SUMMARY OF THE INVENTION

According to the invention, provision is made for a method for the production of a cooling plate of a material with very good thermal conductivity, such as copper, aluminum, alloy thereof, or the like, with pins, protruding approximately perpendicular beyond a base on an effective surface swept by coolant, with the pins being surrounded by a substantially radially extending flat functionally necessary peripheral edge, and the cooling plate is produced in a tool by forming a workpiece, which method is characterized in that the workpiece in the form of a flat material blank with uniform material thickness is placed precisely centered in the tool, which includes at least one outer punch (peripheral edge punch) for producing the substantially flat peripheral edge and an inner punch (pin punch) which cooperates with pin forming openings in the tool for producing the pins, that the peripheral edge is formed with reduced material thickness by the outer punch through pressing as the inner punch holds down the workpiece, and that then the pins are formed by the inner punch through pressing in cooperation with the pin forming openings of the tool as the outer punch is held down.

Thus, the invention employs a cost-effective cold pressing or pressing with heating, and the material of the flat material blank is directly used through forming, when the pins are formed on the effective surface that is swept by the coolant, so that the production in accordance with the invention does not encounter a substantial loss of material and material waste and a material-saving and resource-friendly production process is realized. Further, the material overhang produced by the method according to the invention is established across the one area of the workpiece, on which the pins are formed on the effective surface during production of the cooling plate. The remaining surface of the flat material blank is not formed during pin formation and therefore offers, for example, suitable bearing surfaces for seals, without requiring additional refinishing. The method according to the invention enables by way of a single forming operation both the formation of the substantially flat, functionally necessary peripheral edge by means of the associated peripheral edge punch (outer punch) and the formation of the pins by means of the inner punch (pin punch) in cooperation with the pin forming openings in the tool.

Preferably, an ejection device is used to close at least some of the pin forming openings of the tool in adjacent relationship to the peripheral edge before and offset by a pin length when forming the peripheral edge by means of the outer punch.

Preferably, in the method according to the invention, the pins are calibrated starting from their free ends. When calibrating, the free ends of the pins are pressed flatly or upset. Further, a counter-conical configuration may also be produced during calibration of the pins, when, starting from the free ends of the pins, such a calibration is implemented by which the diameter of the pins starting from the free end becomes smaller in direction of the foot area.

As an alternative, the calibration may also provide a conical configuration, when starting from the free ends of the pins, such a calibration is implemented by which the diameter of the pins starting from the free ends becomes greater in direction of the foot area.

Suitably, the flat material blank has a tetragonal configuration. In particular, a rectangular flat material blank may be involved.

Preferably, the flat material blank is formed from rolled or pressed material, in particular from rolled copper.

In summary, it is essential in the method according to the invention that the cooling plates are produced with the pins solely by a forming process.

BRIEF DESCRIPTION OF THE DRAWINGS

Further details, features and advantages of the invention will become apparent from the following description of preferred exemplary embodiments without limiting character, with reference to the accompanying drawings. It is shown in:

FIG. 1 a schematic sectional view of an example for use of a cooling plate according to the invention;

FIGS. 2 to 7 schematic perspective partial sectional views to elucidate the process sequence in the production method of a cooling plate according to the invention;

FIG. 8 and FIG. 9 enlarged cutaway views of individual pins of the cooling plate shown in FIG. 7, and lastly in FIGS. 10 to 12 schematic examples of further embodiments of the pins.

DETAILED DESCRIPTION OF PREFERRED EMBODIMENTS

Figure 10:
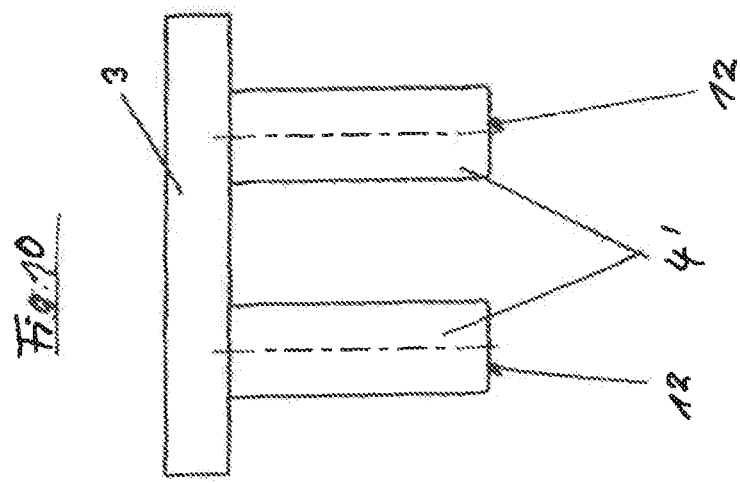

In the figures of the drawing, same or similar parts are designated by same reference numerals.

FIG. 1 shows schematically an example for use of a cooling arrangement according to the invention, generally designated by 1. A cooling plate 3 is attached via the surface opposite to the pins on a component 2 to be cooled, such as an electrical or electronic component. As shown, the cooling plate 3 includes pins 4 on an effective surface 5 which is swept by coolant. In the illustrated example, a cover 7 is connected via a seal 6 in a fluid-tight manner to the substantially radially extending, flat peripheral edge U, which surrounds the pins 4, such that a gap 8 is formed between the cover 7 and the pins 4 of the cooling plate 3 and is flowed through by a coolant 9, such as cooling liquid or cooling fluid.

The process sequence according to the invention for the production of a cooling plate of a material with very good thermal conductivity will be explained hi more detail with reference to FIGS. 2 to 7.

FIG. 2 depicts schematically a partial sectional view of a tool W, which has many forming openings 20 at the bottom. An ejector device closes at least some of the forming openings 20 that are adjacent to the peripheral edge U. Indicated schematically at a distance to the tool W is a workpiece WS in the form of a flat material blank. This workpiece WS has a uniform or same material thickness in FIG. 2.

As readily apparent from FIG. 3, the workpiece WS or the flat material blank 10 is placed precisely centered in the tool W resting on its bottom. As can be seen from FIG. 3, the flat material blank 10 is arranged in the tool W such that a predetermined distance A is maintained hi circumferential direction between the lateral boundaries of the tool W and the outer circumference of the flat material blank 10.

FIG. 4 shows a schematic partial sectional view of a punch assembly, generally designated by 22. This punch assembly 22 includes at least one outer punch or peripheral edge punch 23 and an inner punch or pin punch 24. This punch assembly 22 is moved according to FIG. 5 toward the flat material blank 10 in such a way that the outer punch 23 forms by pressing the peripheral edge U with a reduced material thickness, as the workpiece WS or 10 is held down by the inner punch 24, As a result, a material overhang 11 is formed in the workpiece WS in relation to the formed peripheral edge U, when compared to FIG. 4. As is further apparent from FIGS. 4 and 5, parts of the ejection device 21 close off in preferred manner at least some of the pin forming openings 20 that are adjacent to the peripheral edge U. As a result, material of the workpiece WS can be effectively prevented from also entering the forming openings 20 during the pressing process for forming the peripheral edge U.

The illustration according to FIG. 6 explains schematically the processing procedure, by which the inner punch 24 forms the pins 4 in cooperation with the pin forming openings 20 through pressing, as the outer punch 23 is held down. As can be seen from FIG. 6, the finished cooling plate 3 has a continuous base comprised of peripheral edge U and the remaining part of the cooling plate 3 with the pins 4. The material thickness of the base of the cooling plate 3 is substantially of same size as at the peripheral edge U.

FIG. 7 illustrates a schematic perspective view of a cooling plate 3 with very closely lying pins 4 on the effective surface 5. The peripheral edge U surrounds the pins 4 and forms a common base with the foot region of the pins 4.

FIG. 8 shows a schematic enlarged illustration of two pins, with the shape of which, as shown in FIGS. 5 and 6, being formed by the interaction of the inner punch 24 through a pressing operation in conjunction with the pin forming openings 20. FIG. 9 illustrates the cooling plate 3 with the pins 4 after undergoing calibration. As can be seen from FIGS. 8 and 9, the pins 4, 4 have, after formation during forming according to FIG. 6, free ends 12, which are slightly curved outward. During the calibration according to FIG. 9, these free ends 12 have been pressed flatly, or they may also be upset.

Figure 11:
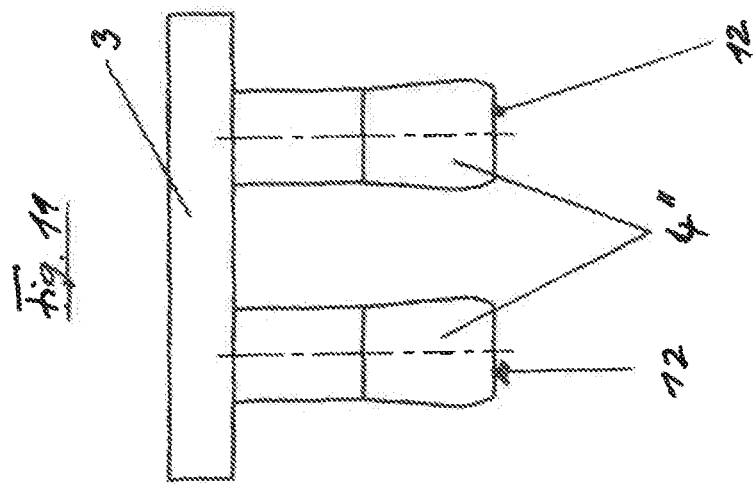
Figure 12:
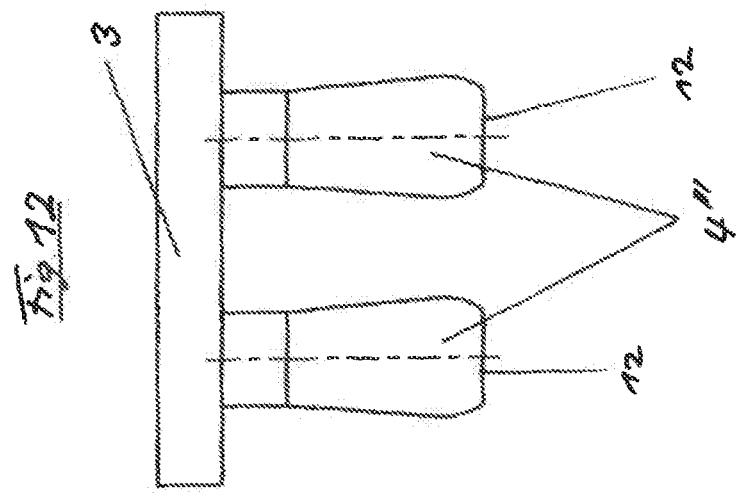

Finally, with reference to FIGS. 10 to 12, further exemplary embodiments of configurations of the pins 4 are shown schematically.

FIG. 10 shows cylindrically shaped pins 4'. FIG. 11 shows as an example a counter-conical configuration of pins 4", which counter-conical configuration, however, extends only approximately over half the height of the respective pin 4". With such a counter-conical configuration, starting from the free ends of the pins 4", such a calibration is implemented by which the diameter of the pins 4", starting from the free end 12, becomes smaller in direction of the foot area.

FIG. 12 also illustrates an example of such a counter-conical construction of pins 4'''. Here, the counter-conical configuration reaches almost to the foot region of the pins 4'''. Alternatively, the pins 4 can be formed as a whole conically or partly conically. This is realized by a corresponding calibration process. In such a case, starting from the free ends 12 of the pins 4, such a calibration is implemented by which the diameter of the pins 4, starting from the free end, increases in direction of the foot area.

Of course, the invention is not limited to the illustrated exemplary embodiments, but numerous changes and modifications are possible, which the artisan will optionally apply, without departing from the spirit of the invention. In particular, the pins 4, 4', 4", 4''' may, depending on the respective field of application, have configurations through calibration, which deviate from the illustrated exemplary embodiments, or may also include combinations of the exemplary embodiments shown in FIGS. 9 to 12. Even though the illustrated examples are based on a rectangular flat material blank 10, the latter may, of course, also be configured generally tetragonal or oval or the like, and a flat material blank of square shape may also be involved.

Preferably, the flat material blank may be formed from rolled or pressed material, in particular from rolled copper. This involves a material with very good thermal conductivity.

What is claimed is:

1. A method for producing a cooling plate, said method comprising:

centering a workpiece in a tool, wherein the workpiece comprises a flat material blank with uniform material thickness;

forming a substantially radially extending flat peripheral edge of the workpiece by pressing an outer punch of the tool against a peripheral edge of the workpiece to thereby reduce the material thickness of the peripheral edge of the workpiece, as the workpiece is held down by an inner punch of the tool; and forming pins on a coolant-swept effective surface of a base of the workpiece by the inner punch through pressing in cooperation with pin forming openings of the tool as the outer punch is held down against the peripheral edge of the workpiece, such that the pins protrude approximately perpendicular beyond the base and are surrounded by the radially extending flat peripheral edge.

2. The method of claim 1, wherein the cooling plate is made of copper, aluminum, or alloys thereof.

3. The method of claim 1, further comprising closing off by an ejection device at least some of the pin forming openings of the tool that are adjacent to the peripheral edge and offset to the peripheral edge by a pin length, when forming the peripheral edge by the outer punch.

4. The method of claim 1, further comprising calibrating the pins starting from their free ends.

5. The method of claim 4, further comprising flatly pressing or upsetting the free ends of the pins during calibration.

6. The method of claim 4, wherein the calibration is executed such that a diameter of the pins, starting from their free ends in a direction of a foot area of the base, becomes smaller to have a counter-conical configuration.

7. The method of claim 4, wherein the calibration is executed such that a diameter of the pins, starting from their free ends in a direction of a foot area of the base, becomes greater to have a conical configuration.

8. The method of claim 1, wherein the flat material blank has a tetragonal configuration.

9. The method of claim 1, wherein the flat material blank has a rectangular configuration.

10. The method of claim 1, further comprising forming the flat material blank from rolled or pressed material.

11. The method of claim 10, further comprising forming the flat material blank from rolled copper.

12. The method of claim 1, further comprising moving the outer punch and the inner punch toward the workpiece to form the substantially radially extending flat peripheral edge of the workpiece and the pins.

* * * * *